(12) United States Patent
Su (10) Patent No.: US 9,159,614 B2
(45) Date of Patent: Oct. 13, 2015

(54) PACKAGING SUBSTRATE AND METHOD FOR MANUFACTURING SAME

(71) Applicant: Zhen Ding Technology Co., Ltd., Tayuan, Taoyuan (TW)

(72) Inventor: Wei-Shuo Su, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 14/140,461

(22) Filed: Dec. 24, 2013

(65) Prior Publication Data
US 2014/0361439 A1 Dec. 11, 2014

(30) Foreign Application Priority Data
Jun. 11, 2013 (CN) .......................... 2013 1 0230281

(51) Int. Cl.
*H01L 23/12* (2006.01)
*H01L 21/768* (2006.01)
*H01L 23/498* (2006.01)
*H01L 21/48* (2006.01)
*H01L 21/683* (2006.01)

(52) U.S. Cl.
CPC ...... *H01L 21/76879* (2013.01); *H01L 21/4857* (2013.01); *H01L 21/6835* (2013.01); *H01L 23/49822* (2013.01); *H01L 2221/68318* (2013.01); *H01L 2221/68345* (2013.01); *H01L 2221/68377* (2013.01)

(58) Field of Classification Search
USPC ......... 257/693, 737, 738, 758, 774, 775, 780, 257/781, E23.021, E23.069, 700, 762, 257/E23.019
See application file for complete search history.

(56) References Cited

U.S. PATENT DOCUMENTS 8,476,754 B2 * 7/2013 Kodani .......................... 257/690
2008/0257596 A1 * 10/2008 Kaneko ......................... 174/264
2013/0270699 A1 * 10/2013 Kuo et al. ..................... 257/738

FOREIGN PATENT DOCUMENTS

JP         201113869 A    7/2011
TW         200943508 A   10/2009

* cited by examiner

*Primary Examiner* — Jasmine Clark
(74) *Attorney, Agent, or Firm* — Novak Druce Connolly Bove + Quigg LLP (57) ABSTRACT

A packaging substrate includes a first wiring layer, a first dielectric layer formed on the first wiring layer, a second wiring layer formed on the first dielectric layer, and a number of copper pillar bumps. Each copper pillar bump includes a base portion and a protruding portion. The base portion is connected to the first wiring layer, and the protruding portion is formed on the base portion. A size of the protruding portion is less than a size of the base portion, and a size of the copper pillar bump gradually increases from the protruding portion to the base portion.

5 Claims, 13 Drawing Sheets

# PACKAGING SUBSTRATE AND METHOD FOR MANUFACTURING SAME

BACKGROUND

1. Technical Field

The present disclosure relates to a packaging substrate and a method for manufacturing the same.

2. Description of Related Art

Packaging substrates generally include a wiring layer, a solder masking layer formed on the wiring layer, and a photo-resisting layer formed on the solder masking layer. A number of first openings is defined in the solder masking layer to expose portions of the wiring layer. The portions of the wiring layer exposed through the first openings serve as contact pads. A number of second openings communicating with the first openings is defined in the photo-resisting layer. A copper layer is plated in each pair of the first opening and the second opening by an electroplating method. The photo-resisting layer is removed from the solder masking layer, and the copper layer plated in each pair of the first opening and the second opening forms a copper portion protruding past the solder masking layer.

As inner diameters of the first opening and the second opening are relatively small, the inner diameter of the second opening is designed to be greater than the inner diameter of the first opening in order to improve an alignment accuracy, which increases an interval between two adjacent copper portions.

Therefore, it is desirable to provide a packaging substrate and a method for manufacturing the same that can overcome the limitations described.

DETAILED DESCRIPTION

Embodiments of the disclosure will be described with reference to the drawings.

FIGS. 1-10 show an embodiment of a method for manufacturing a packaging substrate 100. The method includes seven steps.

Figure 1:
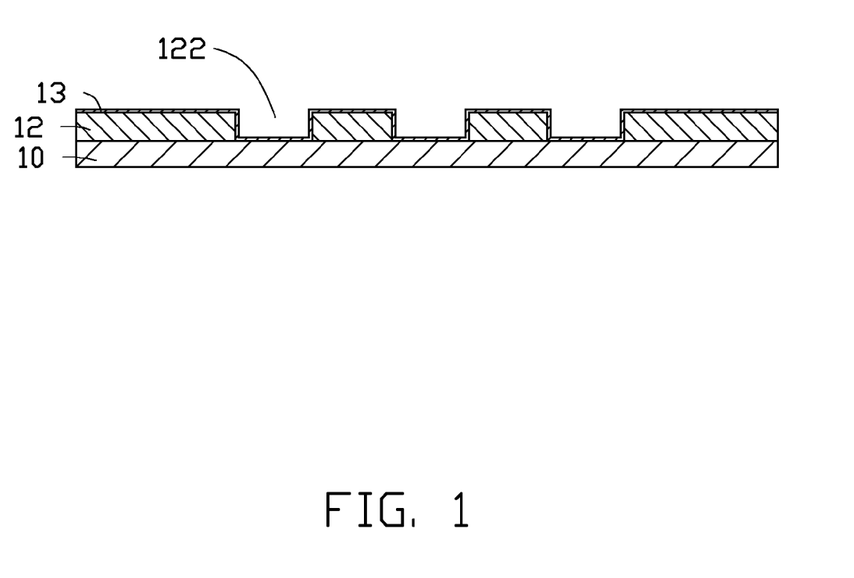
FIG. 1 is a cross-sectional view of a first embodiment of a first photo-resisting layer formed on a copper foil layer.

In the first step, referring to FIG. 1, a first photo-resisting layer 12 is formed on a copper foil layer 10 an patterned. The first photo-resisting layer 12 defines a plurality of first openings 122 to expose portions of the copper foil layer 10. A first conductive layer 13 is continuously formed on exposed surfaces of the first photo-resisting layer 12 and the copper foil layer 10. The first conductive layer 13 is formed via an electroless plating process.

In the embodiment, the first photo-resisting layer 12 can be formed by a method of spreading, curing, and patterning a liquid photoresist ink, or by a method of pressing and patterning a dry film photoresist. The electroless plating process can be a chemical plating process.

Figure 2:
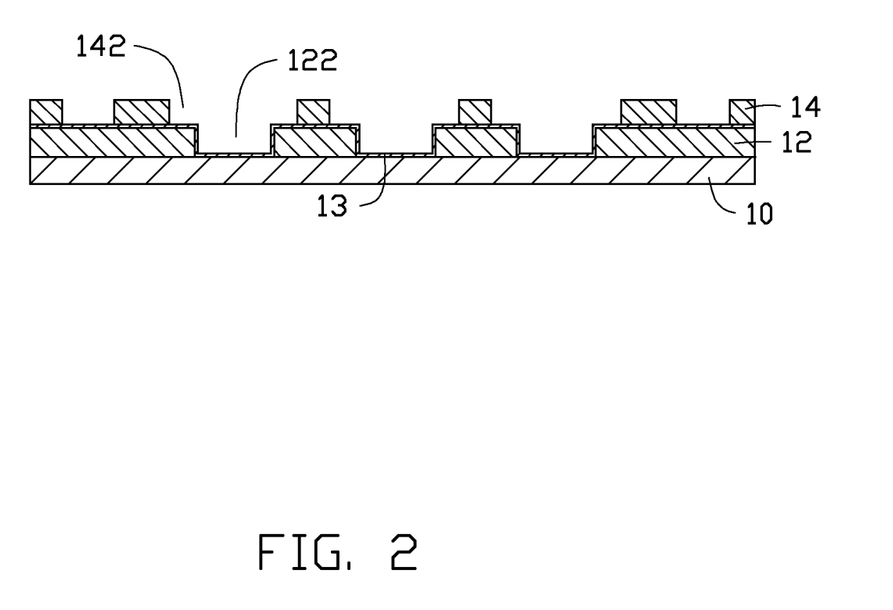
FIG. 2 is a cross-sectional view of a second photo-resisting layer formed on the first photo-resisting layer of FIG. 1.

In the second step, referring to FIG. 2, a second photo-resisting layer 14 is formed on portions of the first conductive layer 13 formed on the first photo-resisting layer 12 and patterned.

In the embodiment, the second photo-resisting layer 14 defines a plurality of second openings 142. Each first opening 122 communicates with a second opening 142, and a size of each second opening 142 is greater than a size of the first opening 122. Thus, portions of the first conductive layer 13 formed on the first photo-resisting layer 12 are not covered by the second photo-resisting layer 14 and are exposed. The first conductive layer 13 is used as a seed layer.

Figure 3:
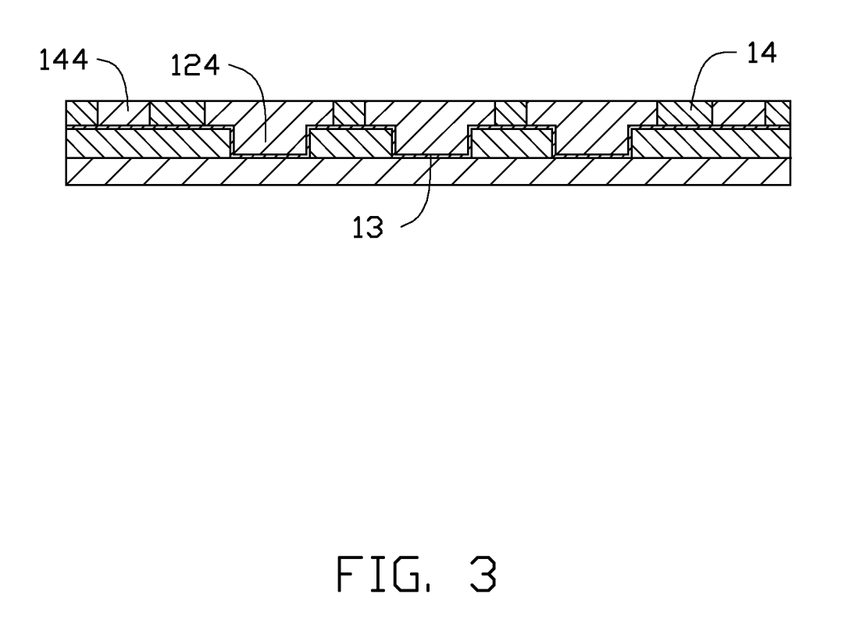
FIG. 3 is a cross-sectional view of an electroplating layer plated in openings defined by the first photo-resisting layer and the second photo-resisting layer of FIG. 2 to form a base portion and a first wiring layer.

In the third step, referring to FIG. 3, copper is filled in the first openings 122 and the second openings 142 via an electroplating process. The copper filled in the first openings 122 forms a base portion 124, and the copper filled in the second openings 142 forms a first wiring layer 144.

Figure 4:
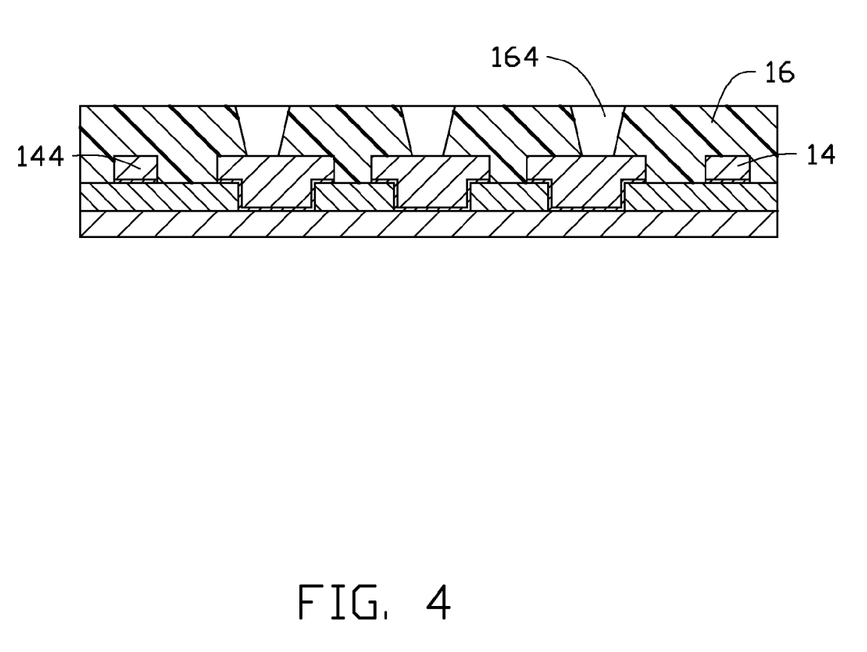
FIG. 4 is a cross-sectional view of the second photo-resisting layer removed and a first dielectric layer formed on the first photo-resisting layer of FIG. 3.
Figure 5:
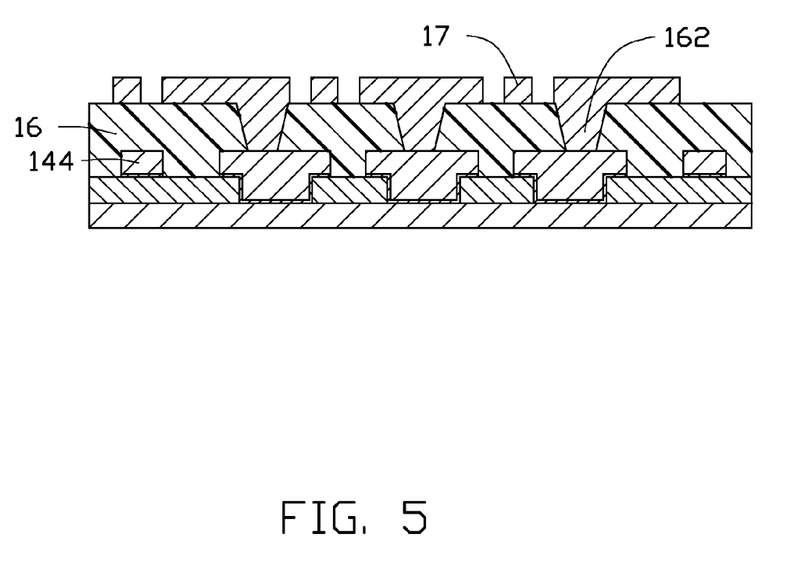
FIG. 5 is a cross-sectional view of a second wiring layer formed on the first dielectric layer of FIG. 4.

In the fourth step, referring to FIGS. 4-5, the second photo-resisting layer 14 and portions of the first conductive layer 13 covered by the second photo-resisting layer 14 are removed. A first dielectric layer 16 and a second wiring layer 17 are orderly formed on the first wiring layer 144.

In the embodiment, the second photo-resisting layer 14 is removed via a stripping process, and the first conductive layer 13 is removed via a flash-rusting process. The first dielectric layer 16 is formed on the first wiring layer 144 via a pressing process, and the first dielectric layer 16 fills in gaps defined by removing the second photo-resisting layer 14 and the portions of the first conductive layer 13. The first wiring layer 144 is electrically connected to the second wiring layer 17 via first conductive via-holes 162. The second wiring layer 17 and the first conductive via-holes 162 are formed via a semi-additive process. A plurality of blind holes 164 is defined in the first dielectric layer 16. The blind holes 164 expose portions of the wiring layer 144. A seed layer (not shown) is continuously formed along exposed surfaces of the first dielectric layer 16, inner surfaces of the bind holes 164, and exposed surfaces of the first wiring layer 144. The seed layer is formed via the electroless plating process. A patterned photo-resisting layer (not shown) is formed on the seed layer, such that portions of the seed layer and the blind holes 164 are exposed from the patterned photo-resisting layer. Copper is filled in the blind holes 164 and formed on the portions of the seed layer exposed from the patterned photo-resisting layer. The copper is formed via the electroplate process. The copper filled in the blind holes 164 forms the first conductive via-holes 162, and the copper formed on the seed layer forms the second wiring layer 17.

It should be understood that if the first conductive layer 13 of the first step is omitted, the first conductive layer 13 will not be flash-rusted in the fourth step. The first photo-resisting layer 12 and the second photo-resisting layer 14 are made of different materials, so a stripping liquid used to remove the second photo-resisting layer 14 will not affect the first photo-resisting layer 12. The second wiring layer 17 can be formed by etching a copper layer, and the first conductive via-holes 162 can be formed by a hole-filling process.

Figure 6:
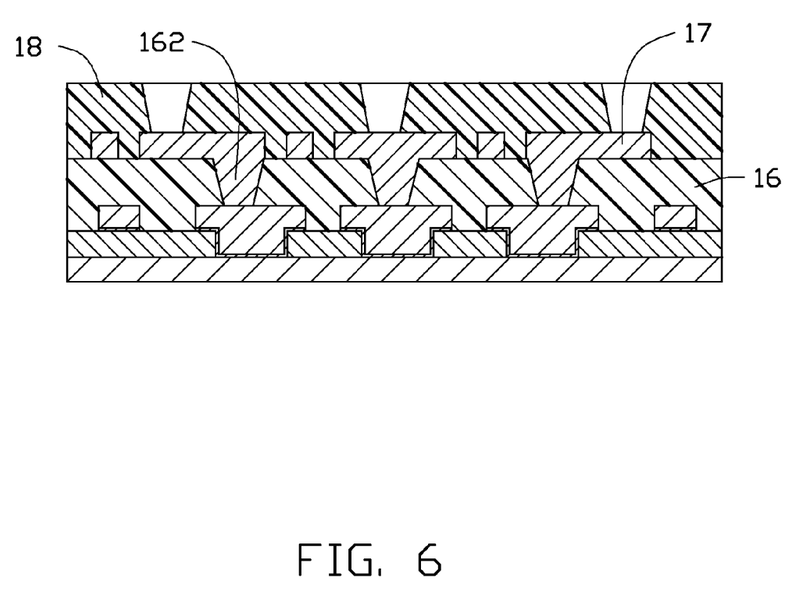
FIG. 6 is a cross-sectional view of a second dielectric layer formed on the second wiring layer of FIG. 5.
Figure 7:
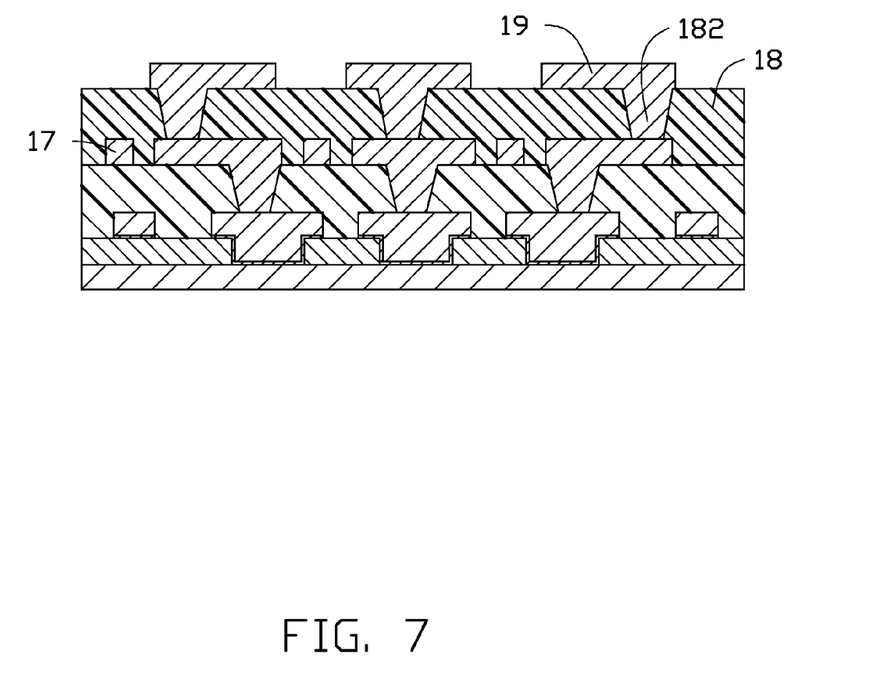
FIG. 7 is a cross-sectional view of a third wiring layer formed on the second dielectric layer of FIG. 6.

In the fifth step, referring to FIGS. 6-7, a second dielectric layer 18 and a third wiring layer 19 are formed on the second wiring layer 17. The second wiring layer 17 is electrically connected to the third wiring layer 19 via second conductive via-holes 182 formed in the second dielectric layer 18. The second dielectric layer 18, the second conductive via-holes 182, and the third wiring layer 19 are formed the same way as the first dielectric layer 16, the first conductive via-holes 162, and the second wiring layer 17 of the fourth step.

Figure 8:
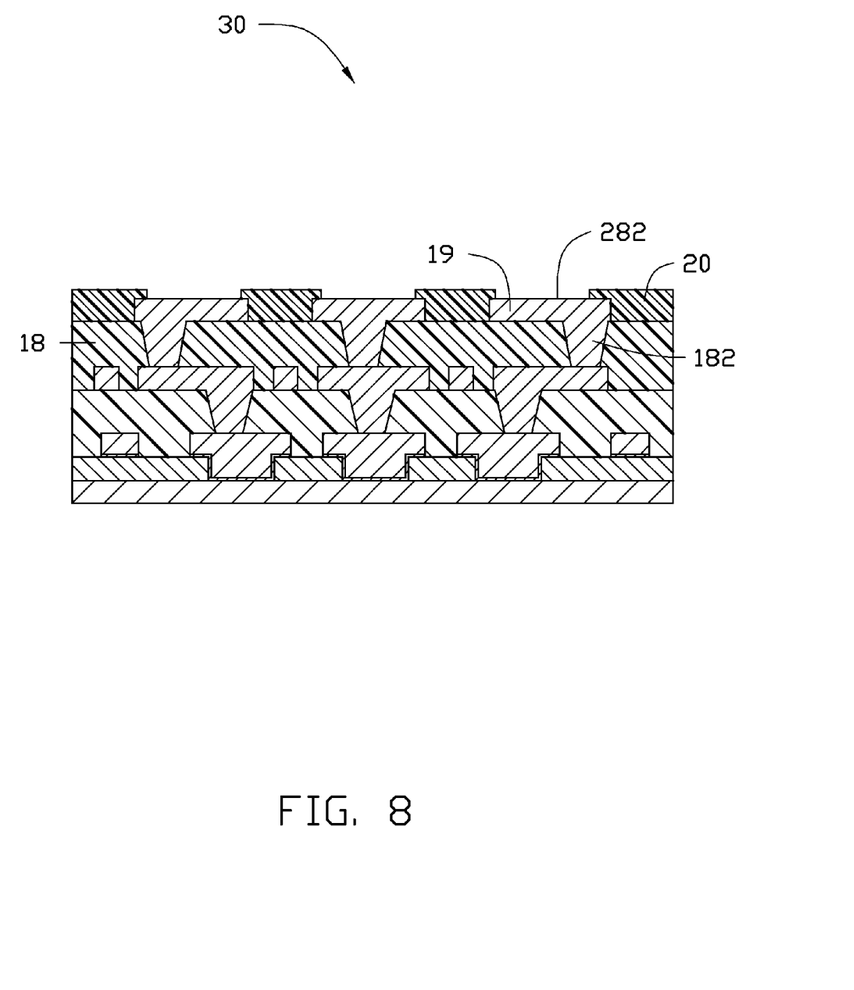
FIG. 8 is a cross-sectional view of a solder masking layer formed on the third wiring layer of FIG. 7.

In the sixth step, referring to FIG. 8, a solder masking layer 20 is formed on the third wiring layer 19 and the second dielectric layer 18. A plurality of openings (not labeled) is defined in the solder masking layer 20. Parts of the third wiring layer 19 exposed from the openings serve as solder pads 282. The copper foil layer 10, the first photo-resisting layer 12, the first wiring layer 144, the first dielectric layer 16, the second wiring layer 17, the second dielectric layer 18, the third wiring layer 19, and the solder masking layer 20 form a multilayer substrate 30.

In the embodiment, the solder pads 282 are used for connecting to chips (not labeled) or circuit boards (not labeled) via solder balls (not labeled).

Figure 9:
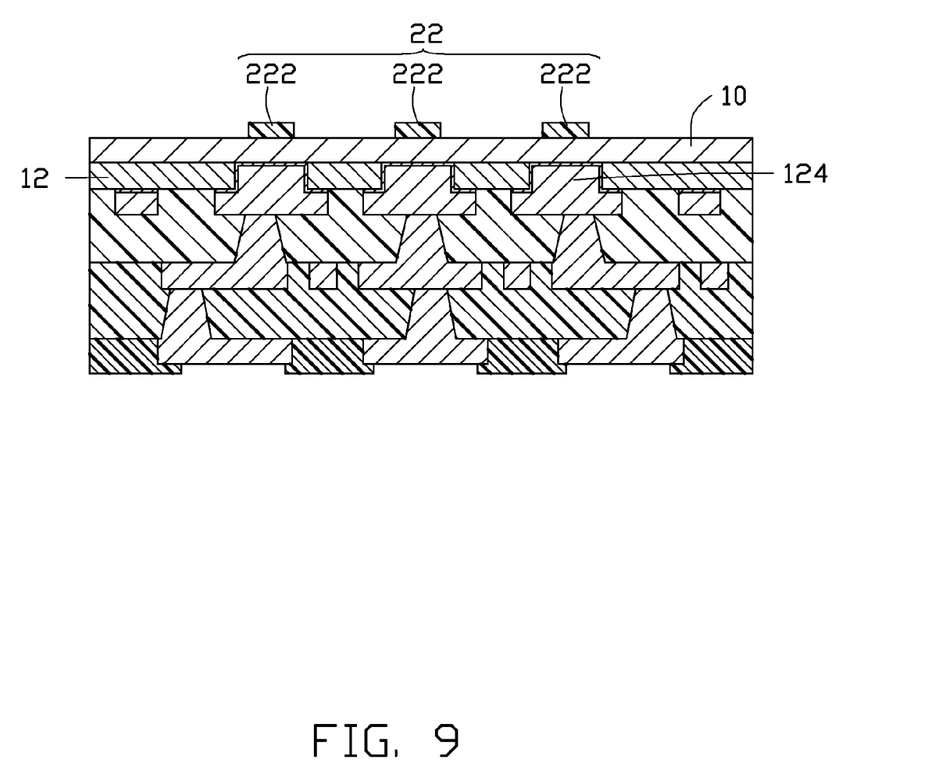
FIG. 9 is a cross-sectional view of a third photo-resisting layer formed on the copper foil layer of FIG. 8.
Figure 10:
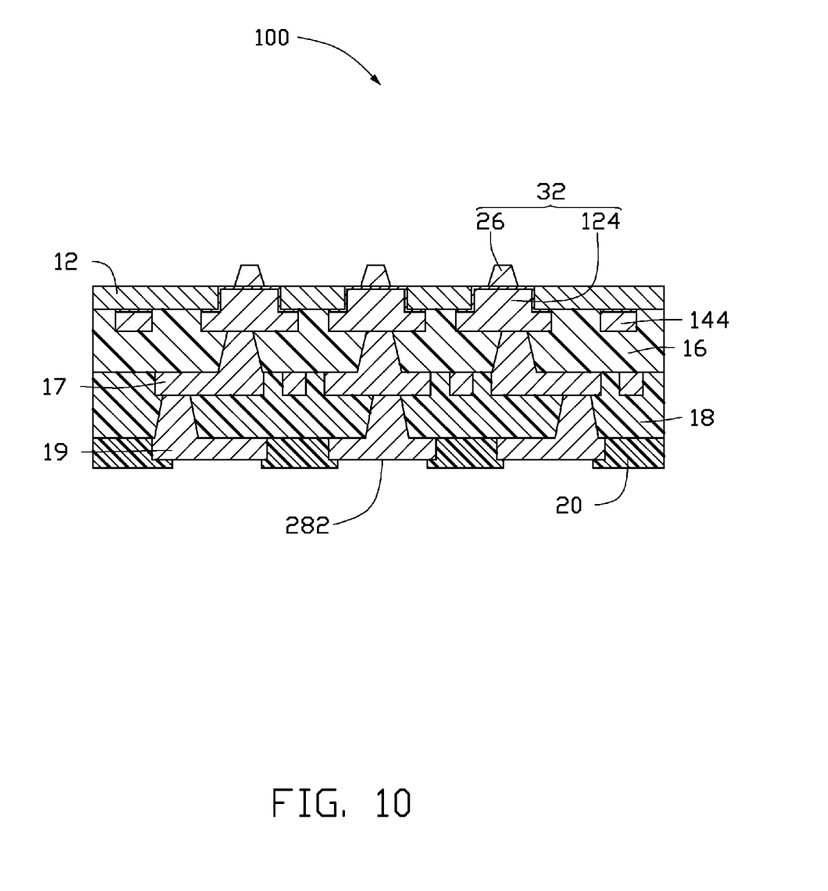
FIG. 10 is a cross-sectional view of a packaging substrate in which the copper foil layer of FIG. 9 is etched.

In the seventh step, referring to FIGS. 9-10, the multilayer substrate 30 is turned over, and a third photo-resisting layer 22 is formed on an exposed side of the copper foil layer 10 and patterned. The third photo-resisting layer 22 includes a plurality of covering portions 222. The covering portions 222 correspond to the base portions 124, and a size of each covering portion 222 is less than a size of the corresponding base portion 124. Exposed portions of the copper foil layer 10 are etched, and the third photo-resisting layer 22 is removed, to form a plurality of protruding portions 26 connected to the base portion 124. Each base portion 124 connected to a protruding portion 26 forms a copper pillar bump 32. A width of the copper pillar bump 32 gradually increases from a distal end thereof to the base portion 124.

In the embodiment, the third photo-resisting layer 22 can be formed by a method of spreading, curing, and patterning a liquid photoresist ink, a method of pressing and patterning a dry film photoresist, or a method of spurting the liquid photoresist ink on portions of the copper foil layer 10.

During the process of etching the copper foil layer 10, as the copper foil layer 10 is etched along a direction from the photo-resisting layer 22 to the base portion 124, portions of the copper foil layer 10 adjacent to the covering portions 222 are more easily etched than the portions of the copper foil layer 10 adjacent to the base portion 124. Thus, the width of the protruding portions 26 gradually increases from the covering portions 222 to the base portion 124, and a cross-section of the protruding portions 26 is substantially an isosceles trapezoid. A size of the protruding portion 26 is less than a size of the base portion 124, and an area of a bottom surface of the protruding portion 26 adjacent to the base portion 124 is less than an area of a top surface of the base portion 124 adjacent to the protruding portion 26.

FIG. 10 shows the packaging substrate 100 including the first wiring layer 144, the first dielectric layer 16, the second wiring layer 17, the second dielectric layer 18, the third wiring layer 19, the solder masking layer 20, the first photo-resisting layer 12, and a plurality of copper pillar bumps 32. The first photo-resisting layer 12, the first wiring layer 144, the first dielectric layer 16, the second wiring layer 17, the second dielectric layer 18, the third wiring layer 19, and the solder masking layer 20 are orderly stacked. The first wiring layer 144 is electrically connected to the second wiring layer 17 via the first conductive via-holes 162 formed in the first dielectric layer 16. The second wiring layer 17 is electrically connected to the third wiring layer 19 via the second conductive via-holes 182 formed in the second dielectric layer 18. The parts of the third wiring layer 19 exposed from the solder masking layer 20 serve as the solder pads 282. Each copper pillar bump 32 includes the base portion 124 and the protruding portion 26. The base portions 124 are formed in the first openings 122 defined in the first photo-resisting layer 12, and the protruding portions 26 are formed on the base portions 124. The size of the protruding portions 26 is less than the size of the base portions 124, and an area of a bottom surface of the protruding portion 26 adjacent to the base portion 124 is less than an area of a top surface of the base portion 124 adjacent to the protruding portion 26. The copper pillar bumps 32 are used to electrically connect to pins of a chip (not shown).

It should be understood that the first photo-resisting layer 12 can be removed after the third photo-resisting layer 22 is removed. A plurality of dielectric layers and wiring layers can be formed on the third wiring layer 19 after the third wiring layer 19 is formed. Therefore, the number of the wiring layers of the packaging substrate 100 is increased.

Figure 11:
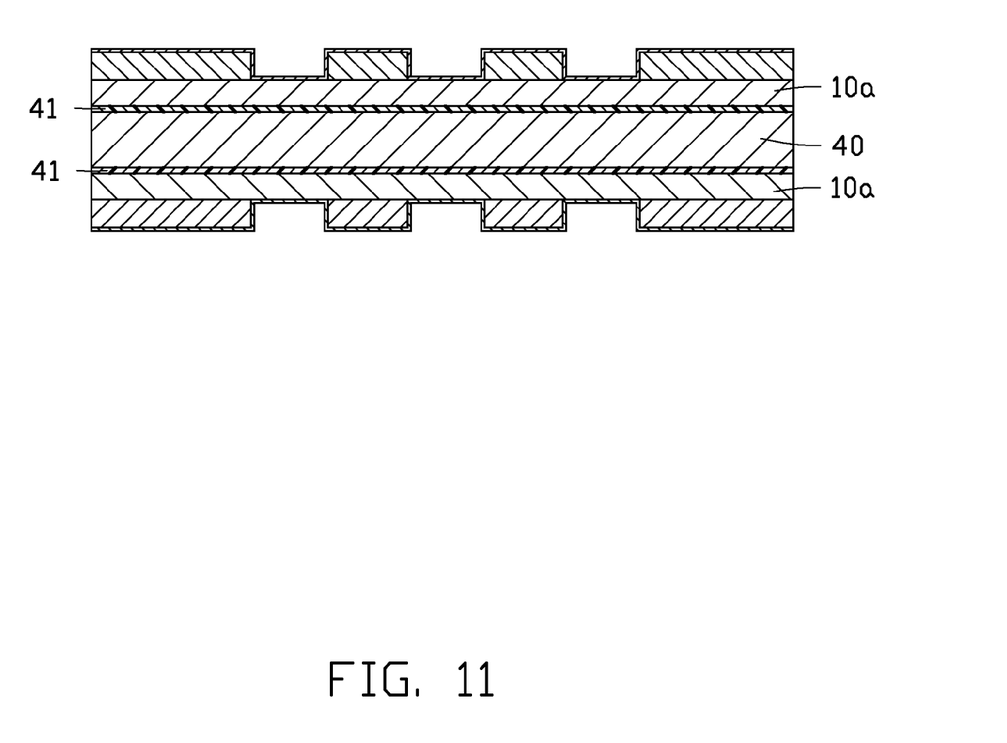
FIG. 11 is a cross-sectional view of a second embodiment of two copper foil layers formed on two opposite surfaces of a supporting plate.
Figure 12:
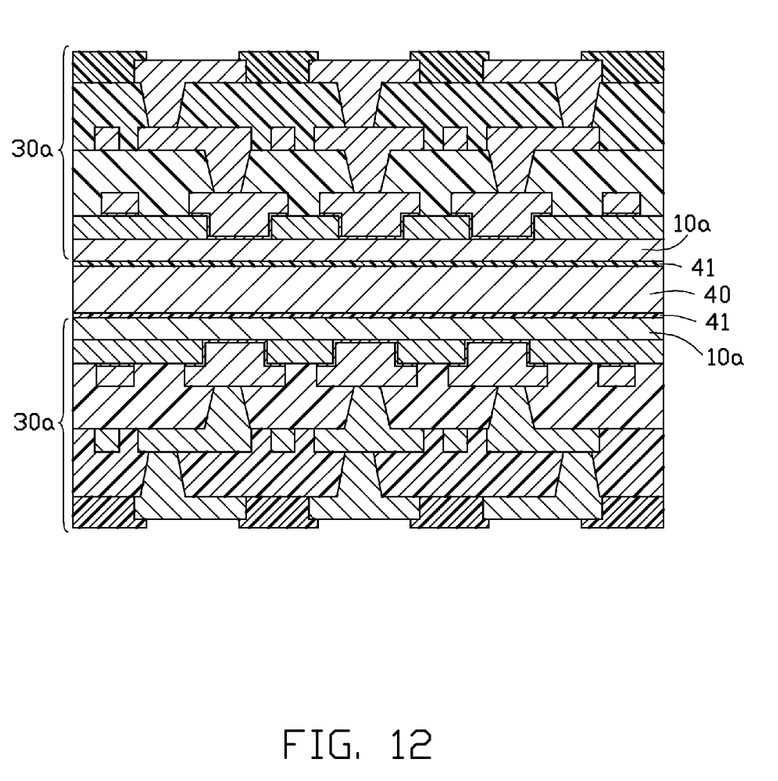
FIG. 12 is a cross-sectional view of two multilayer substrates formed on two opposite surface of the supporting plate of FIG. 11, wherein each multilayer substrate includes a copper foil layer, a first photo-resisting layer, a first wiring layer, a first dielectric layer, a second wiring layer, a second dielectric layer, a third wiring layer, and a solder masking layer.
Figure 13:
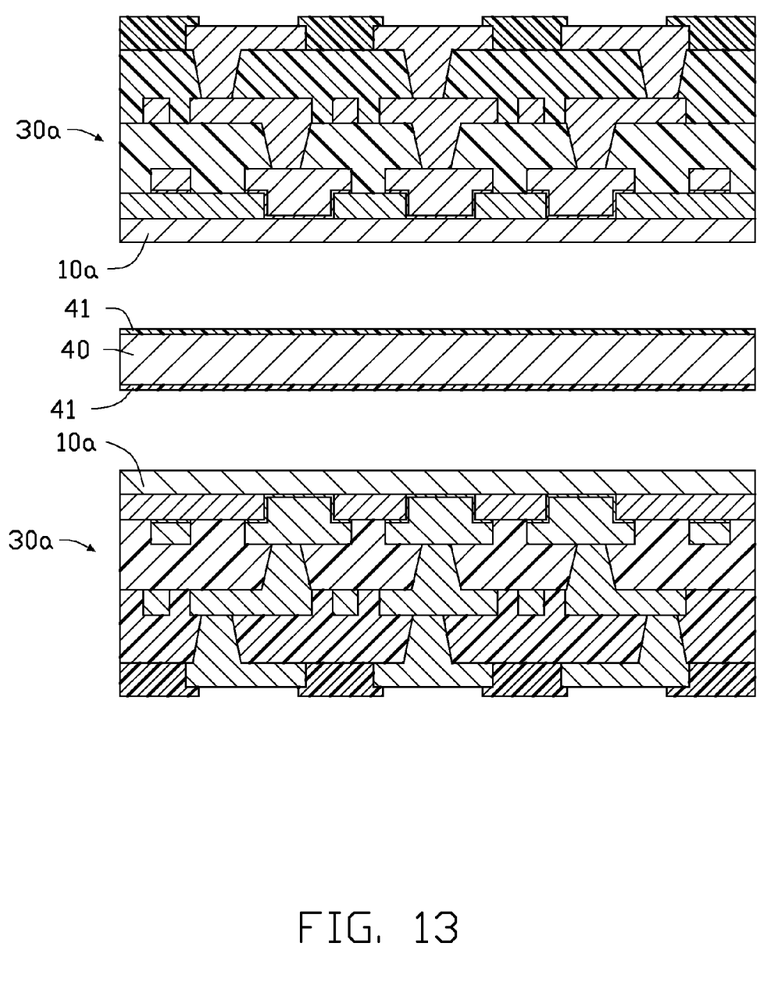
FIG. 13 is a cross-sectional view of two multilayer substrates of FIG. 12 separated from the supporting plate.

FIGS. 11-13 show a second embodiment of a method for manufacturing a packaging substrate 100.

A supporting plate 40 and two release films 41 attached on two sides of the supporting plate 40 are provided. Two copper foil layers 10a are covered on the two release films 41 respectively. The supporting plate 40 is used to support the two copper foil layers 10a. The supporting plate 40 is made of polyimide, glass-fiber laminate, or metal. The release film 41 is a double faced film, and is made of PET. The release film 41 is adhered between the copper foil layers 10a and the supporting plate 40.

Two multilayer substrates 30a are formed on the two copper foil layers 10a respectively via the same way as the first to sixth steps of FIGS. 1-8. The structure of each multilayer substrate 30a is the same as the structure of the multilayer substrate 30.

The multilayer substrates 30a are peeled off from the supporting plate 40. The multilayer substrates 30a are processed to the packaging substrate 100 via the same way as the seventh step of FIGS. 9-10.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A packaging substrate, comprising:
   a first wiring layer;
   a first dielectric layer formed on the first wiring layer;

a second wiring layer formed on the first dielectric layer;
a plurality of copper pillar bumps, each copper pillar bump comprising a base portion and a protruding portion; the base portion connected to the first wiring layer and portions of the first wiring layer exposed from the base portion, the protruding portion formed on the base portion; and
a first conductive layer formed on surfaces of the first wiring layer exposed from the base portion, and formed on surfaces of the base portion away from the first wiring layer, and formed on side surfaces of the base portion;
wherein a size of the protruding portion is less than a size of the base portion, and a size of the copper pillar bumps gradually increases from the protruding portion to the base portion.

2. The packaging substrate of claim 1, wherein the first wiring layer is electrically connected to the second wiring layer via first conductive via-holes.

3. The packaging substrate of claim 1, further comprising a second dielectric layer and a third wiring layer, wherein the second dielectric layer and the third wiring layer are orderly formed on the second wiring layer.

4. The packaging substrate of claim 3, wherein the second wiring layer is electrically connected to the third wiring layer via second conductive via-holes.

5. The packaging substrate of claim 3, wherein a solder masking layer is formed on the third wiring layer, parts of the third wiring layer exposing from the solder masking layer server as solder pads.

* * * * *